(12) United States Patent
Chen et al.

(10) Patent No.: US 10,895,262 B2
(45) Date of Patent: Jan. 19, 2021

(54) PUMP MODULE HAVING TWO IMPELLERS IN SERIES AND A MULTIPLE PLATE HOUSING

(71) Applicant: AURAS Technology Co., Ltd., New Taipei (TW)

(72) Inventors: Chien-An Chen, New Taipei (TW); Mu-Shu Fan, New Taipei (TW); Chien-Yu Chen, New Taipei (TW)

(73) Assignee: AURAS TECHNOLOGY CO., LTD., New Taipei (TW)

( * ) Notice: Subject to any disclaimer, the term of this patent is extended or adjusted under 35 U.S.C. 154(b) by 132 days.

(21) Appl. No.: 16/167,834

(22) Filed: Oct. 23, 2018

(65) Prior Publication Data
US 2019/0187763 A1    Jun. 20, 2019

(30) Foreign Application Priority Data

Dec. 15, 2017 (TW) .................................. 106144236

(51) Int. Cl.
| | |
|---|---|
| *F04D 13/14* | (2006.01) |
| *G06F 1/20* | (2006.01) |
| *F04D 15/00* | (2006.01) |
| *H05K 7/20* | (2006.01) |
| *H01L 23/473* | (2006.01) |
| *F04D 13/12* | (2006.01) |
| *F04D 3/00* | (2006.01) |
| *F04D 1/06* | (2006.01) |

(Continued)

(52) U.S. Cl.
CPC ......... *F04D 13/14* (2013.01); *F04D 15/0066* (2013.01); *F04D 29/007* (2013.01); *F04D 29/04* (2013.01); *F04D 29/086* (2013.01); *F04D 29/426* (2013.01); *F04D 29/648* (2013.01); *G06F 1/20* (2013.01); *G06F 2200/201* (2013.01); *H01L 23/473* (2013.01); *H05K 7/20272* (2013.01)

(58) Field of Classification Search
CPC ...... F04D 29/04; F04D 29/007; F04D 29/086; F04D 29/42; F04D 29/62; F04D 29/648
See application file for complete search history.

(56) References Cited

U.S. PATENT DOCUMENTS

2005/0123418 A1* 6/2005 Manole ..................... G06F 1/20
417/410.3
2007/0110592 A1* 5/2007 Liu ..................... H01L 23/4006
417/313

(Continued)

*Primary Examiner* — Bryan M Lettman
*Assistant Examiner* — Timothy P Solak
(74) *Attorney, Agent, or Firm* — WPAT, PC

(57) ABSTRACT

A pump module includes a main body, a first pump and a second pump. The main body includes a fluid channel, a first mounting hole and a second mounting hole. The fluid channel is exposed through the first mounting hole and the second mounting hole. The first pump is installed in the first mounting hole and sealedly coupled with the first mounting hole. The second pump is installed in the second mounting hole and sealedly coupled with the second mounting hole. A working liquid in the fluid channel is transferred through the first pump and the second pump sequentially. Even if one of the first pump and the second pump is damaged, the other of the first pump and the second pump is normally operated to move the working liquid in the fluid channel.

7 Claims, 5 Drawing Sheets

(51) Int. Cl.
*F04D 29/04* (2006.01)
*F04D 29/00* (2006.01)
*F04D 29/42* (2006.01)
*F04D 29/08* (2006.01)
*F04D 29/64* (2006.01)

(56) References Cited

U.S. PATENT DOCUMENTS

| | | | | |
|---|---|---|---|---|
| 2013/0299139 | A1* | 11/2013 | Mounioloux | G06F 1/20 |
| | | | | 165/120 |
| 2014/0069614 | A1* | 3/2014 | Chiu | F28D 15/00 |
| | | | | 165/104.13 |
| 2014/0071623 | A1* | 3/2014 | Suzuki | H05K 7/20272 |
| | | | | 361/699 |
| 2014/0271123 | A1* | 9/2014 | Rosinski | F04D 13/14 |
| | | | | 415/60 |
| 2016/0338223 | A1* | 11/2016 | Tsai | G06F 1/20 |

\* cited by examiner

PUMP MODULE HAVING TWO IMPELLERS IN SERIES AND A MULTIPLE PLATE HOUSING

FIELD OF THE INVENTION

The present invention relates to a pump module, and more particularly to a pump module with two pumps.

BACKGROUND OF THE INVENTION

With increasing development of computers and various electronic devices, people in the modern societies are used to using computers and electronic devices for a long time. During operations of computers and electronic devices, a great deal of heat is generated. If the heat cannot be effectively dissipated away, some drawbacks occur. For facilitating heat dissipation, a cooling distribution unit (CDU) has been disclosed.

Conventionally, the cooling distribution unit comprises a pump. The pump is used for moving a working liquid in the cooling distribution unit. Consequently, the working liquid is circulated between the pump and a water-cooling radiator. However, if the pump of the conventional cooling distribution unit is suffered from malfunction, the overall cooling distribution unit cannot be normally operated. As known, the pump is readily damaged after a long-term operation. Moreover, the pump is installed in the inner portion of the conventional cooling distribution unit. In case that the pump is damaged, it is difficult to replace the pump. In other words, the conventional pump needs to be further improved.

SUMMARY OF THE INVENTION

For solving the drawbacks of the conventional technologies, the present invention provides a pump module with at least two pumps. Even if one pump is damaged, the pump module can be normally operated.

In accordance with an aspect of the present invention, there is provided a pump module for moving a working liquid. The pump module includes a main body, a first pump and a second pump. The main body includes an inlet, an outlet, a fluid channel, a first mounting hole and a second mounting hole. The working medium is introduced into the fluid channel through the inlet and exited from the fluid channel through the outlet. The fluid channel is exposed through the first mounting hole and the second mounting hole. The first pump is installed in the first mounting hole, and includes a first stator and a first rotator. The first stator is sealedly coupled with the first mounting hole, and the first rotator is disposed within the fluid channel to move the working liquid in the fluid channel. The second pump is installed in the second mounting hole, and includes a second stator and a second rotator. The second stator is sealedly coupled with the second mounting hole, and the second rotator is disposed within the fluid channel to move the working liquid in the fluid channel. The working liquid in the fluid channel is transferred through the first rotator and the second rotator sequentially.

In an embodiment, the pump module further includes a circuit board, and the circuit board is electrically connected with the first stator and the second stator to drive rotation of the first rotator and the second rotator.

In an embodiment, the pump module further includes a pluggable casing. The main body, the first pump, the second pump and the circuit board are accommodated within the pluggable casing. The pluggable casing is detachably plugged into a cooling distribution unit. When the pluggable casing is plugged into the cooling distribution unit, the fluid channel is in fluid communication with the cooling distribution unit, and the circuit board is electrically connected with the cooling distribution unit.

In an embodiment, the main body further includes a top plate, an intermediate plate and a bottom plate. The top plate, the intermediate plate and the bottom plate are sequentially stacked on each other from top to bottom to define the fluid channel.

In an embodiment, the top plate includes a first top groove, a second top groove and a third top groove. The intermediate plate includes a first intermediate opening, a second intermediate opening, a third intermediate opening and a fourth intermediate opening. The bottom plate includes a first bottom groove and a second bottom groove. After the top plate, the intermediate plate and the bottom plate are stacked on each other, the first top groove, the second top groove, the third top groove, the first intermediate opening, the second intermediate opening, the third intermediate opening, the fourth intermediate opening, the first bottom groove and the second bottom groove are in communication with each other. After the working liquid is introduced into the main body through the inlet, the working liquid is transferred through the first top groove, the first intermediate opening, the first bottom groove, the second intermediate opening, the second top groove, the third intermediate opening, the second bottom groove, the fourth intermediate opening and the third top groove sequentially and outputted from the main body through the outlet.

In an embodiment, the pump module further includes a first positioning post and a second positioning post. The first positioning post is disposed within the first bottom groove. The second positioning post is disposed within the second bottom groove. The first positioning post is a rotation shaft of the first rotator. The first rotator is rotatably coupled with the first positioning post. The second positioning post is a rotation shaft of the second rotator. The second rotator is rotatably coupled with the second positioning post.

In an embodiment, the first rotator includes a first bushing and a first impeller, which are connected with each other. The second rotator includes a second bushing and a second impeller, which are connected with each other. The first bushing is sheathed around the first positioning post. The first impeller is rotated relative to the first positioning post to move the working liquid while the first rotator is driven by the first stator. The second bushing is sheathed around the second positioning post. The second impeller is rotated relative to the second positioning post to move the working liquid while the second rotator is driven by the second stator.

In an embodiment, the first bushing and the first impeller of the first pump are exposed. The first impeller is inserted into the fluid channel of the main body when the first bushing is sheathed around the first positioning post. The second bushing and the second impeller of the second pump are exposed. The second impeller is inserted into the fluid channel of the main body when the second bushing is sheathed around the second positioning post.

In an embodiment, the first pump and the second pump are arranged side by side and located at a side of the main body.

From the above descriptions, the pump module of present invention comprises at least two pumps (e.g., the first pump and the second pump). The at least two pumps are installed in the fluid channel. In case that one pump is damaged, the pump module can be operated to assist in heat dissipation. Moreover, the impellers of the pumps are exposed outside, and the pumps are sealedly coupled with the corresponding mounting holes of the main body. Consequently, the impellers of the stators are inserted into the fluid channel to move the working liquid.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

In this context, the pump module comprises a fluid channel and plural pumps. A working liquid flows through the fluid channel. The plural pumps are installed on the fluid channel to move the working liquid. As the working liquid is circulated by the pumps, the heat contained in the working liquid is transferred to the surroundings. Consequently, the temperature of a target heat source (not shown) is reduced.

Figure 1:
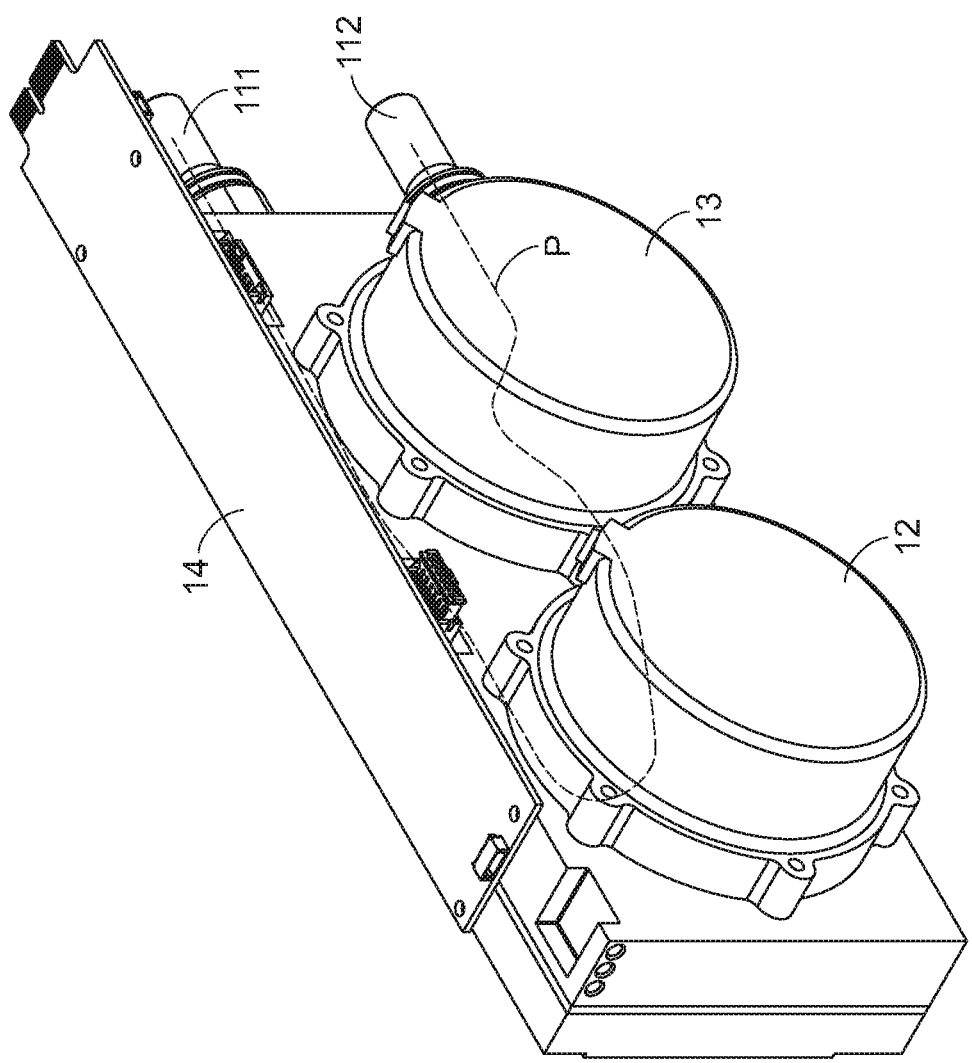
FIG. 1 is a schematic perspective view illustrating a pump module according to an embodiment of the present invention.
Figure 2:
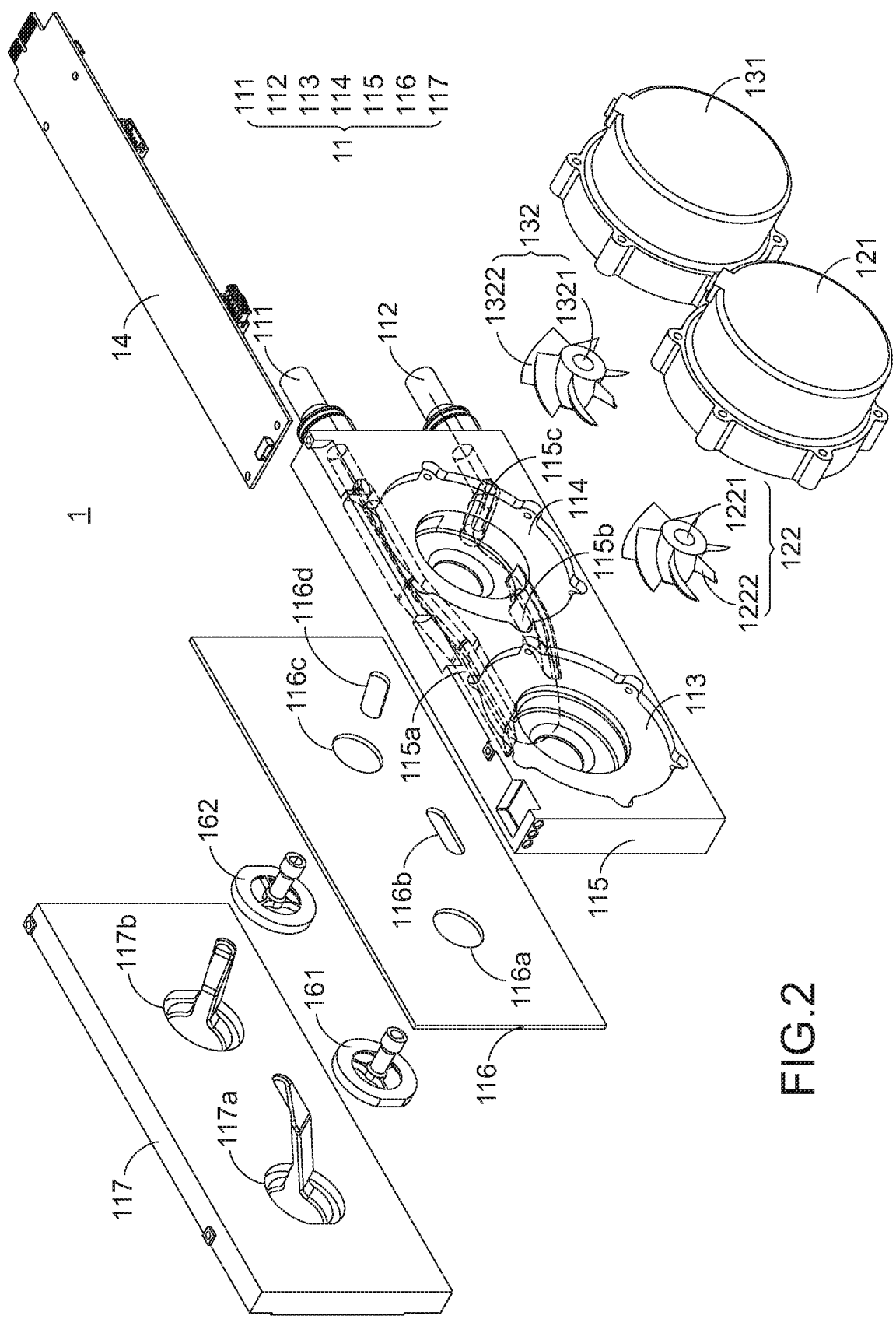
FIG. 2 is a schematic exploded view illustrating the pump module according to the embodiment of the present invention and taken along a viewpoint.
Figure 3:
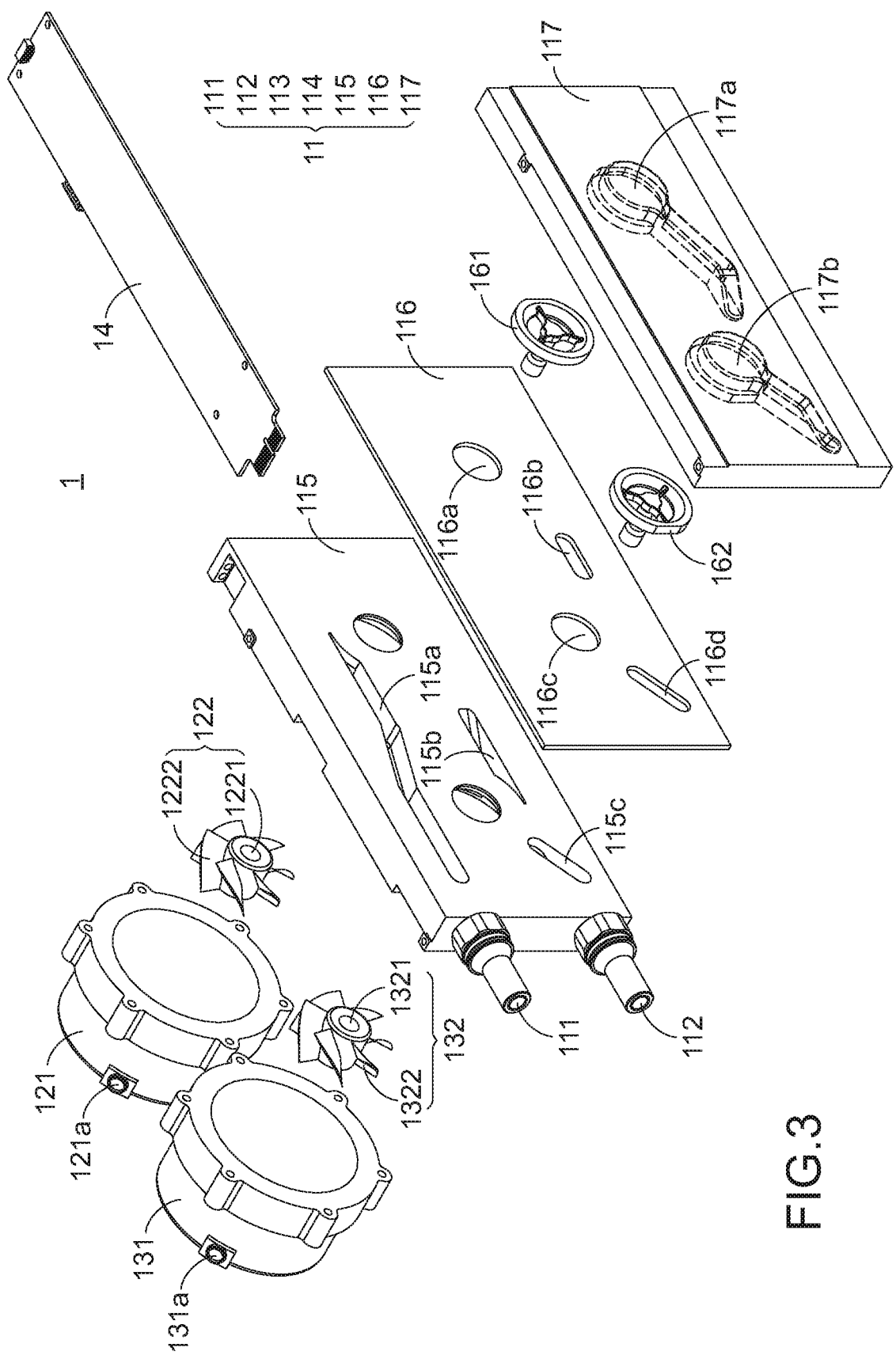
FIG. 3 is a schematic exploded view illustrating the pump module according to the embodiment of the present invention and taken along another viewpoint.

Please refer to FIGS. 1, 2 and 3. FIG. 1 is a schematic perspective view illustrating a pump module according to an embodiment of the present invention. FIG. 2 is a schematic exploded view illustrating the pump module according to the embodiment of the present invention and taken along a viewpoint. FIG. 3 is a schematic exploded view illustrating the pump module according to the embodiment of the present invention and taken along another viewpoint. The pump module 1 comprises a main body 11, a first pump 12, a second pump 13 and a circuit board 14. The first pump 12 and the second pump 13 are assembled with the main body 11. Consequently, a fluid channel P is defined.

The main body 11 comprises an inlet 111, an outlet 112, a portion of the fluid channel P, a first mounting hole 113 and a second mounting hole 114. The fluid channel P is exposed through the first mounting hole 113 and the second mounting hole 114. After the first pump 12 is installed in the first mounting hole 113 and the second pump 13 is installed in the second mounting hole 114, the fluid channel P is sealed and the working liquid is prevented from leakage through the first mounting hole 113 or the second mounting hole 114. In other words, the fluid channel P is defined by the first pump 12, the second pump 13 and the main body 11 collaboratively. Consequently, the working medium is introduced into the fluid channel P through the inlet 111 only and exited from the fluid channel P through the outlet 112.

The first pump 12 comprises a first stator 121 and a first rotator 122. The second pump 13 comprises a second stator 131 and a second rotator 132. The circuit board 14 is electrically connected with an electric contact 121a of the first stator 121 and an electric contact 131a of the second stator 131 through electric wires (not shown) in order to drive the rotation of the first rotator 122 and the second rotator 132. The first stator 121 is sealedly coupled with the first mounting hole 113, and the first rotator 122 is disposed within the fluid channel P to move the working liquid in the fluid channel P. The second stator 131 is sealedly coupled with the second mounting hole 114, and the second rotator 132 is disposed within the fluid channel P to move the working liquid in the fluid channel P. The first pump 12 and the second pump 13 are arranged in the fluid channel P sequentially. After the working liquid in the fluid channel P is transferred to the first rotator 122 and moved by the first rotator 122, the working liquid is transferred to the second rotator 132 and moved by the second rotator 132.

The fluid channel P and the flowing direction of the working liquid in the fluid channel P will be described in more details as follows. The main body 11 further comprises a top plate 115, an intermediate plate 116 and a bottom plate 117. The top plate 115, the intermediate plate 116 and the bottom plate 117 are sequentially stacked on each other from top to bottom. Consequently, the fluid channel P is defined. The top plate 115 comprises a first top groove 115a, a second top groove 115b and a third top groove 115c. The intermediate plate 116 comprises a first intermediate opening 116a, a second intermediate opening 116b, a third intermediate opening 116c and a fourth intermediate opening 116d. The bottom plate 117 comprises a first bottom groove 117a and a second bottom groove 117b. After the top plate 115, the intermediate plate 116 and the bottom plate 117 are stacked on each other, the first top groove 115a, the second top groove 115b, the third top groove 115c, the first intermediate opening 116a, the second intermediate opening 116b, the third intermediate opening 116c, the fourth intermediate opening 116d, the first bottom groove 117a and the second bottom groove 117b are in communication with each other. After the working liquid is introduced into the main body 11 through the inlet 111, the working liquid is transferred through the first top groove 115a, the first intermediate opening 116a, the first bottom groove 117a, the second intermediate opening 116b, the second top groove 115b, the third intermediate opening 116c, the second bottom groove 117b, the fourth intermediate opening 116d and the third top groove 115c sequentially. Then, the working liquid is outputted from the main body 11 through the outlet 112. The combination of the three plates (i.e., the top plate 115, the intermediate plate 116 and the bottom plate 117) has the following benefits. For example, in case that the structure of the intermediate plate 116 is changed according to the practical requirements, the serial connection between the first pump 12 and the second pump 13 may be adjusted. In another embodiment, the top plate 115 and the intermediate plate 116 are integrally formed, and then the integral structure of the top plate 115 and the intermediate plate 116 is stacked on the bottom plate 117.

The pump module 1 further comprises a first positioning post 161 and a second positioning post 162. The first positioning post 161 is disposed within the first bottom groove 117a. The second positioning post 162 is disposed within the second bottom groove 117b. The first positioning post 161 is used as a rotation shaft of the first rotator 122. That is, the first rotator 122 is rotatably coupled with the first positioning post 161. The second positioning post 162 is a rotation shaft of the second rotator 132. That is, the second rotator 132 is rotatably coupled with the second positioning post 162. The first rotator 122 comprises a first bushing 1221 and a first impeller 1222, which are connected with each other. In addition, the first bushing 1221 and the first impeller 1222 are exposed outside the first pump 12. The second rotator 132 comprises a second bushing 1321 and a second impeller 1322, which are connected with each other. In addition, the second bushing 1321 and the second impeller 1322 are exposed outside the second pump 13. The first bushing 1221 is sheathed around the first positioning post 161. The first impeller 1222 is disposed within the fluid channel P of the main body 11. While the first rotator 122 is driven by the first stator 121, the first impeller 1222 is rotated relative to the first positioning post 161 by using the first positioning post 161 as the rotation shaft. Consequently, the working liquid within the fluid channel P is moved by the first impeller 1222. The second bushing 1321 is sheathed around the second positioning post 162. The second impeller 1322 is disposed within the fluid channel P of the main body 11. While the second rotator 132 is driven by the second stator 131, the second impeller 1322 is rotated relative to the second positioning post 162 by using the second positioning post 162 as the rotation shaft. Consequently, the working liquid within the fluid channel P is moved by the second impeller 1322. In another embodiment, the first positioning post 161 and the second positioning post 162 are integrally formed with the top plate 115 and the intermediate plate 116, and then the integral structure of the top plate 115 and the intermediate plate 116 is stacked on the bottom plate 117.

Preferably but not exclusively, the first pump 12 and the second pump 13 are arranged side by side and located at a first side of the main body 11, and the inlet 111 and the outlet 112 are arranged side by side and located at a second side of the main body 11. The first side and the second side of the main body 11 are perpendicular to each other.

Figure 4:
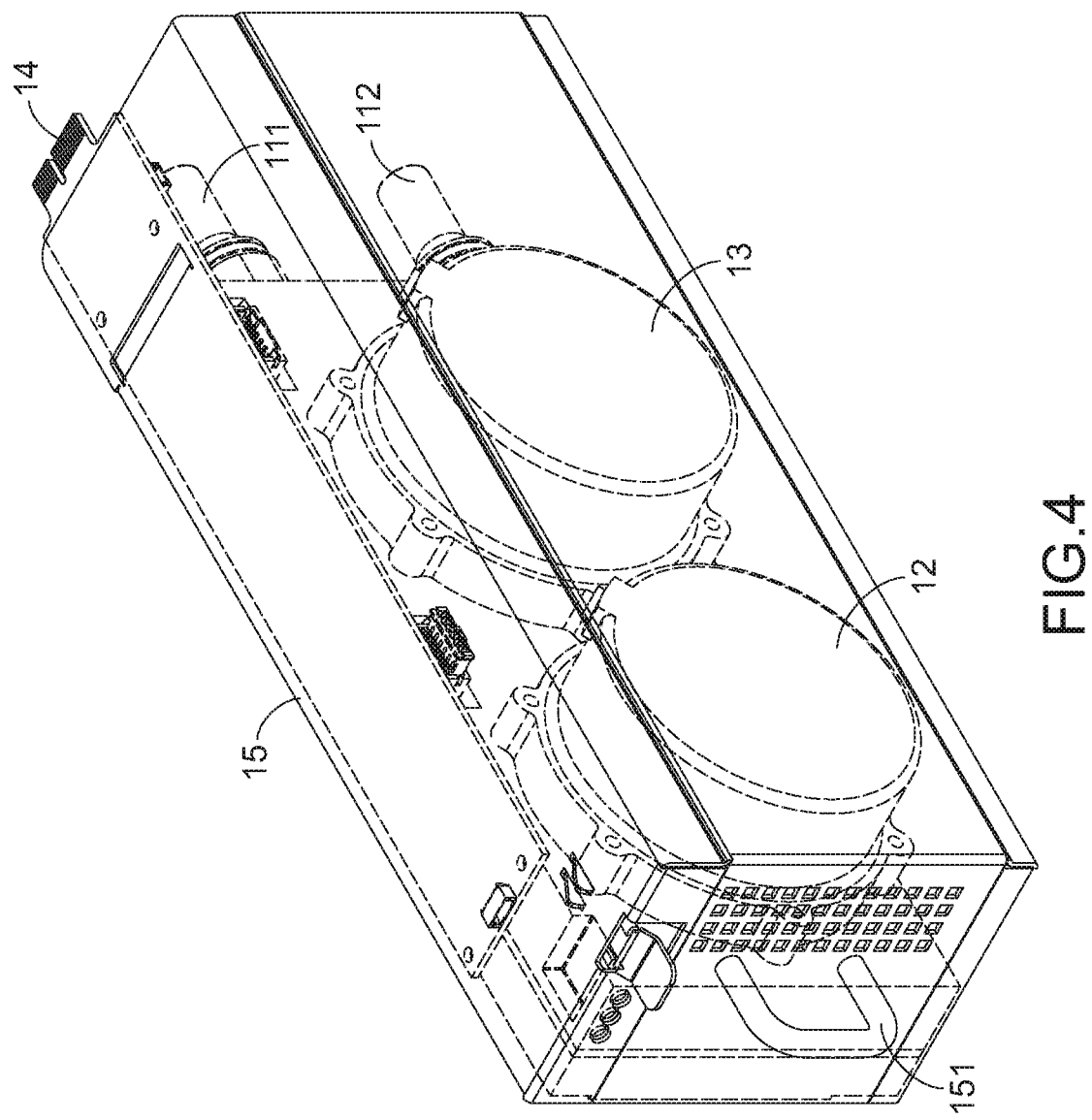
FIG. 4 is a schematic perspective view illustrating a variant example of the pump module of the present invention, in which the pump module further comprises a pluggable casing.
Figure 5:
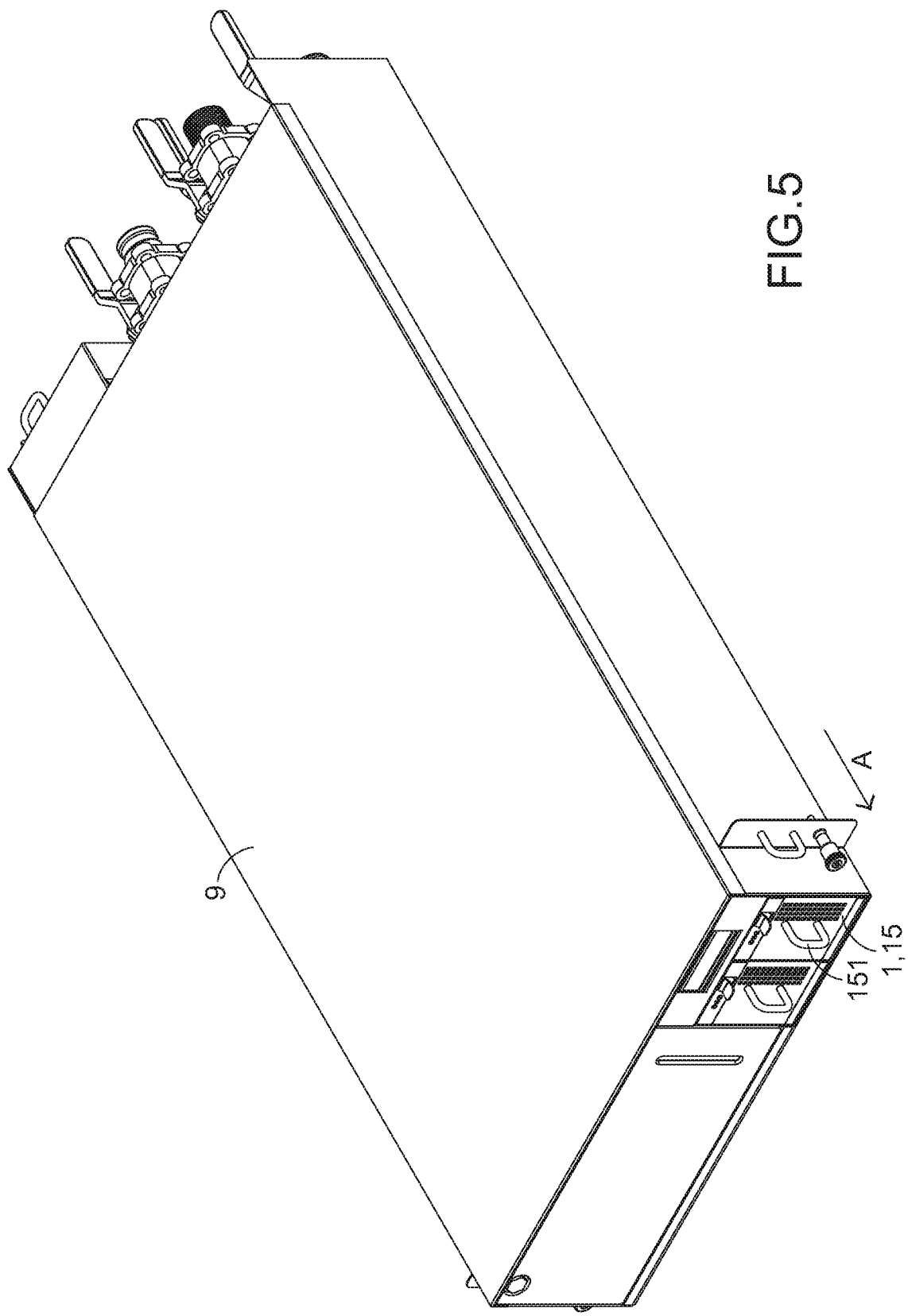
FIG. 5 schematic perspective view illustrating the pump module of FIG. 4, in which the pluggable casing is plugged into a cooling distribution unit.

Please refer to FIGS. 4 and 5. FIG. 4 is a schematic perspective view illustrating a variant example of the pump module of the present invention, in which the pump module further comprises a pluggable casing. FIG. 5 schematic perspective view illustrating the pump module of FIG. 4, in which the pluggable casing is plugged into a cooling distribution unit. The pump module of the present invention further comprises a pluggable casing 15. The main body 11, the first pump 12, the second pump 13 and the circuit board 14 are accommodated within the pluggable casing 15. The pluggable casing 15 is substantially a rectangular box-shaped structure. In addition, a handle 151 is located at a front end of the pluggable casing 15. When the handle 151 is held by the user, the pluggable casing 15 can be pulled out along a pulling direction A. After the pluggable casing 15 is pulled out, the pump module 1 can be maintained or repaired by the user. As shown in FIG. 5, the pluggable casing 15 is detachably plugged into a cooling distribution unit (CDU) 9. The cooling distribution unit 9 is used for controlling the temperature and adjusting the circulation of the working liquid to a target heat source. When the pluggable casing 15 is plugged into the cooling distribution unit 9, the fluid channel P is in fluid communication with the cooling distribution unit 9, and the circuit board 14 is electrically connected with the cooling distribution unit 9.

From the above descriptions, the pump module of present invention comprises at least two pumps (e.g., the first pump and the second pump). The at least two pumps are installed in the fluid channel. In case that one pump is damaged, the pump module can be operated to assist in heat dissipation. Moreover, the impellers of the pumps are exposed outside, and the pumps are sealedly coupled with the corresponding mounting holes of the main body. Consequently, the impellers of the stators are inserted into the fluid channel to move the working liquid.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A pump module for moving a working liquid, the pump module comprising:
   a main body comprising a top plate, an intermediate plate, a bottom plate, an inlet, an outlet, a fluid channel, a first mounting hole and a second mounting hole, wherein the top plate comprises a first top groove, a second top groove and a third top groove, the intermediate plate comprises a first intermediate opening, a second intermediate opening, a third intermediate opening and a fourth intermediate opening, and the bottom plate comprises a first bottom groove and a second bottom groove, wherein after the top plate, the intermediate plate and the bottom plate are sequentially stacked on each other from top to bottom, the first top groove, the second top groove, the third top groove, the first intermediate opening, the second intermediate opening, the third intermediate opening, the fourth intermediate opening, the first bottom groove and the second bottom groove are in communication with each other to define the fluid channel, wherein after the working liquid is introduced into the main body through the inlet, the working liquid is transferred through the first top groove, the first intermediate opening, the first bottom groove, the second intermediate opening, the second top groove, the third intermediate opening, the second bottom groove, the fourth intermediate opening and the third top groove sequentially and outputted from the main body through the outlet, wherein the fluid channel is exposed through the first mounting hole and the second mounting hole;
   a first pump installed in the first mounting hole, and comprising a first stator and a first rotator, wherein the first stator is sealedly coupled with the first mounting hole, and the first rotator is disposed within the fluid channel to move the working liquid in the fluid channel; and
   a second pump installed in the second mounting hole, and comprising a second stator and a second rotator, wherein the second stator is sealedly coupled with the second mounting hole, and the second rotator is disposed within the fluid channel to move the working liquid in the fluid channel,
   wherein the working liquid in the fluid channel is transferred through the first rotator and the second rotator sequentially.

2. The pump module according to claim 1, wherein the pump module further comprises a circuit board, and the circuit board is electrically connected with the first stator and the second stator to drive rotation of the first rotator and the second rotator.

3. The pump module according to claim 2, wherein the pump module further comprises a pluggable casing, wherein the main body, the first pump, the second pump and the circuit board are accommodated within the pluggable casing, and the pluggable casing is detachably plugged into a cooling distribution unit, wherein when the pluggable casing is plugged into the cooling distribution unit, the fluid channel is in fluid communication with the cooling distribution unit, and the circuit board is electrically connected with the cooling distribution unit.

4. The pump module according to claim 1, wherein the pump module further comprises a first positioning post and a second positioning post, wherein the first positioning post is disposed within the first bottom groove, and the second positioning post is disposed within the second bottom groove, wherein the first positioning post is a rotation shaft of the first rotator, and the first rotator is rotatably coupled with the first positioning post, wherein the second positioning post is a rotation shaft of the second rotator, and the second rotator is rotatably coupled with the second positioning post.

5. The pump module according to claim 4, wherein the first rotator comprises a first bushing and a first impeller, which are connected with each other, wherein the second rotator comprises a second bushing and a second impeller, which are connected with each other, wherein the first bushing is sheathed around the first positioning post, and the first impeller is rotated relative to the first positioning post to move the working liquid while the first rotator is driven by the first stator, wherein the second bushing is sheathed around the second positioning post, and the second impeller is rotated relative to the second positioning post to move the working liquid while the second rotator is driven by the second stator.

6. The pump module according to claim 5, wherein the first bushing and the first impeller of the first pump are exposed, and the first impeller is inserted into the fluid channel of the main body when the first bushing is sheathed around the first positioning post, wherein the second bushing and the second impeller of the second pump are exposed, and the second impeller is inserted into the fluid channel of the main body when the second bushing is sheathed around the second positioning post.

7. The pump module according to claim 1, wherein the first pump and the second pump are arranged side by side and located at a side of the main body.

\* \* \* \* \*